(12) United States Patent
Fang

(10) Patent No.: US 6,775,309 B2
(45) Date of Patent: Aug. 10, 2004

(54) SEMICONDUCTOR LASER STRUCTURE AND METHOD OF MANUFACTURING SAME

(75) Inventor: Ruiyu Fang, Torino (IT)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/178,793

(22) Filed: Jun. 25, 2002

(65) Prior Publication Data

US 2003/0007529 A1 Jan. 9, 2003

(30) Foreign Application Priority Data

Jun. 25, 2001 (EP) .............................. 01305504

(51) Int. Cl.[7] .............................................. H01S 5/00
(52) U.S. Cl. .......................... 372/43; 372/43; 372/44; 372/45; 372/46; 372/47; 372/48; 372/49; 372/50
(58) Field of Search ................... 372/43–50

(56) References Cited

U.S. PATENT DOCUMENTS

| | | | | |
|---|---|---|---|---|
| 4,829,347 A | * | 5/1989 | Cheng et al. ............... 257/192 |
| 5,325,385 A | * | 6/1994 | Kasukawa et al. ............ 372/46 |
| 5,400,355 A | * | 3/1995 | Ishida .......................... 372/46 |
| 5,696,389 A | * | 12/1997 | Ishikawa et al. ............. 257/99 |
| 5,822,349 A | * | 10/1998 | Takaoka et al. ............... 372/46 |
| 6,030,452 A | * | 2/2000 | Takeuchi ..................... 117/104 |
| 6,198,863 B1 | * | 3/2001 | Lealman et al. ............. 385/37 |
| 6,437,372 B1 | * | 8/2002 | Geva et al. ................... 257/94 |
| 6,542,525 B1 | * | 4/2003 | Matsumoto et al. .......... 372/26 |
| 6,556,605 B1 | * | 4/2003 | Shtengel et al. ............. 372/46 |

OTHER PUBLICATIONS

Patent Abstracts of Japan Publication No. 09214045, Publication Date Aug. 15, 1997.
Patent Abstracts of Japan Publication No. 2000216500, Publication Date Aug. 4, 2000.
"Chromium–doped semi–insulating InP grown by metalorganic vapour phase epitaxy", M.J. Harlow, W.J. Duncan, I. F. Lealman, P.C. Spurdens*.
"Analysis of Leakage Current in Buried Heterostructure Lasers with Semiinsulating Blocking Layers" Susumu Asada, Shigeo Sugou, Ken–Ichi Kasahara, and Shigetaka Kumashiro.

* cited by examiner

*Primary Examiner*—Don Wong
*Assistant Examiner*—Delma R. Flores Ruiz

(57) ABSTRACT

A semiconductor laser having a mesa structure includes active laser layers. The mesa structure is confined by Fe—InP lateral semi-insulating layers. A p blocking layer is interposed between the mesa structure and the lateral semi-insulating layers. Performance at high temperature and linear laser operation are improved. A preferred application is for manufacturing SIBH-DFB lasers for direct modulation in the 10 Gbit/s range.

16 Claims, 4 Drawing Sheets

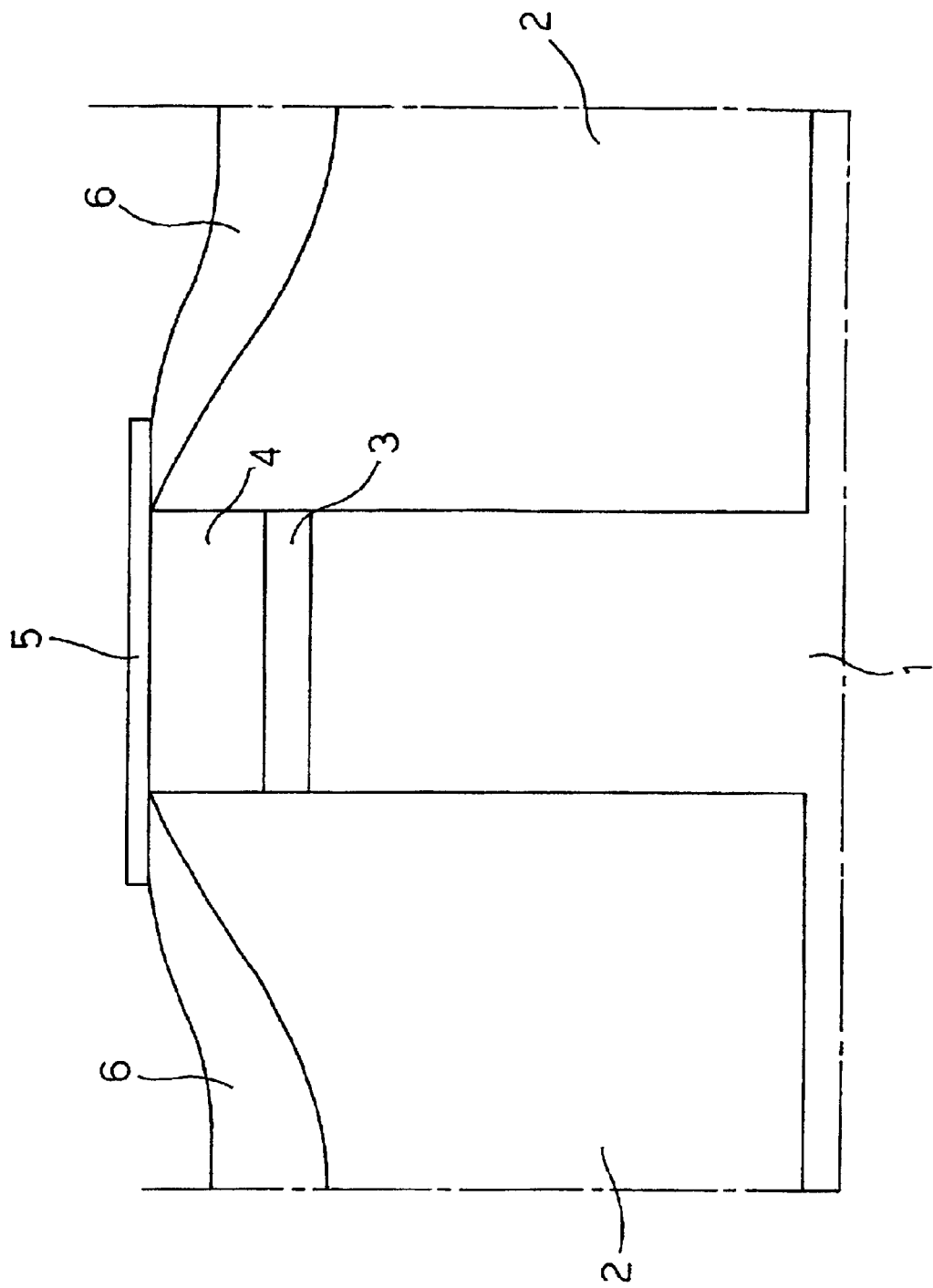

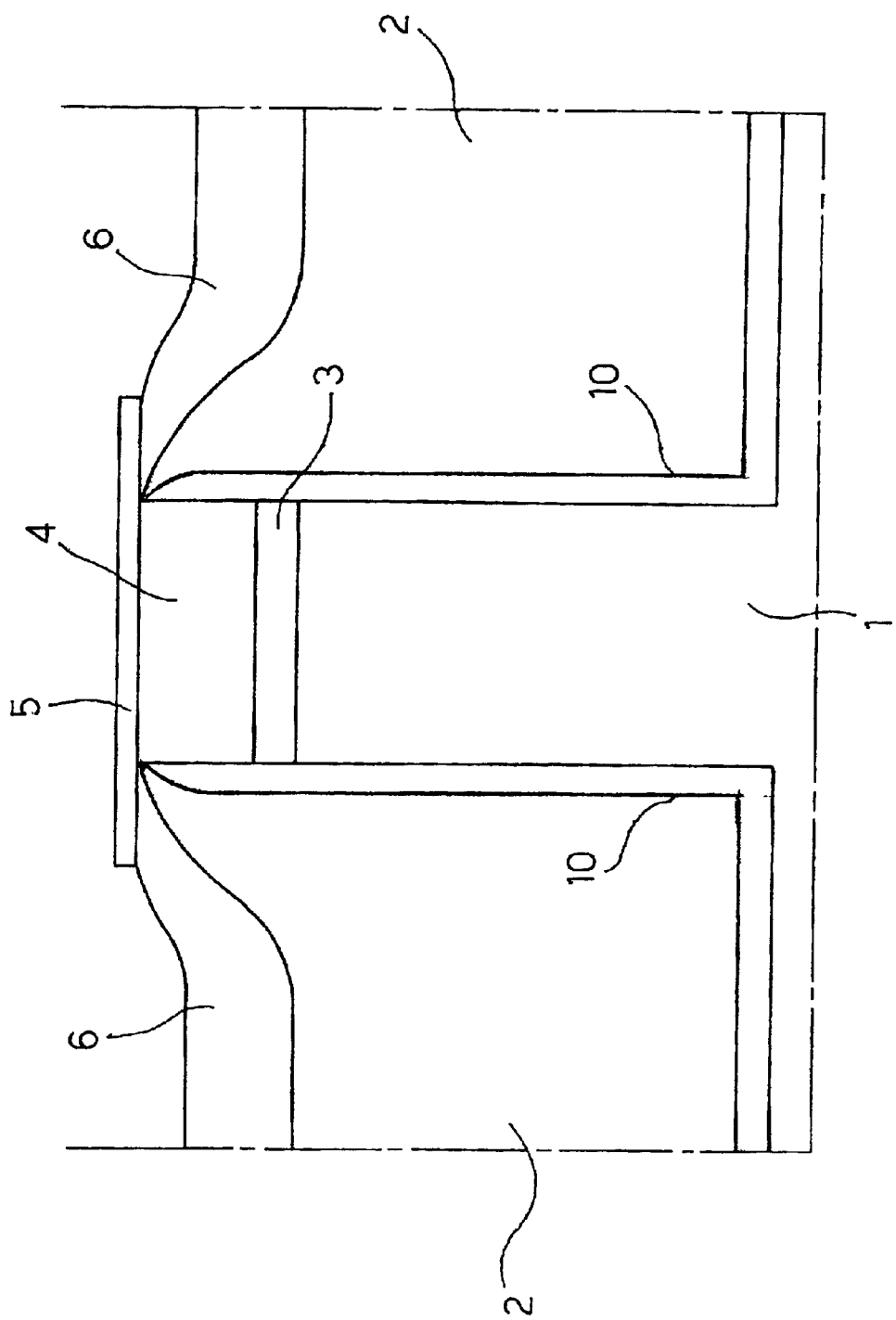

Figure 8:
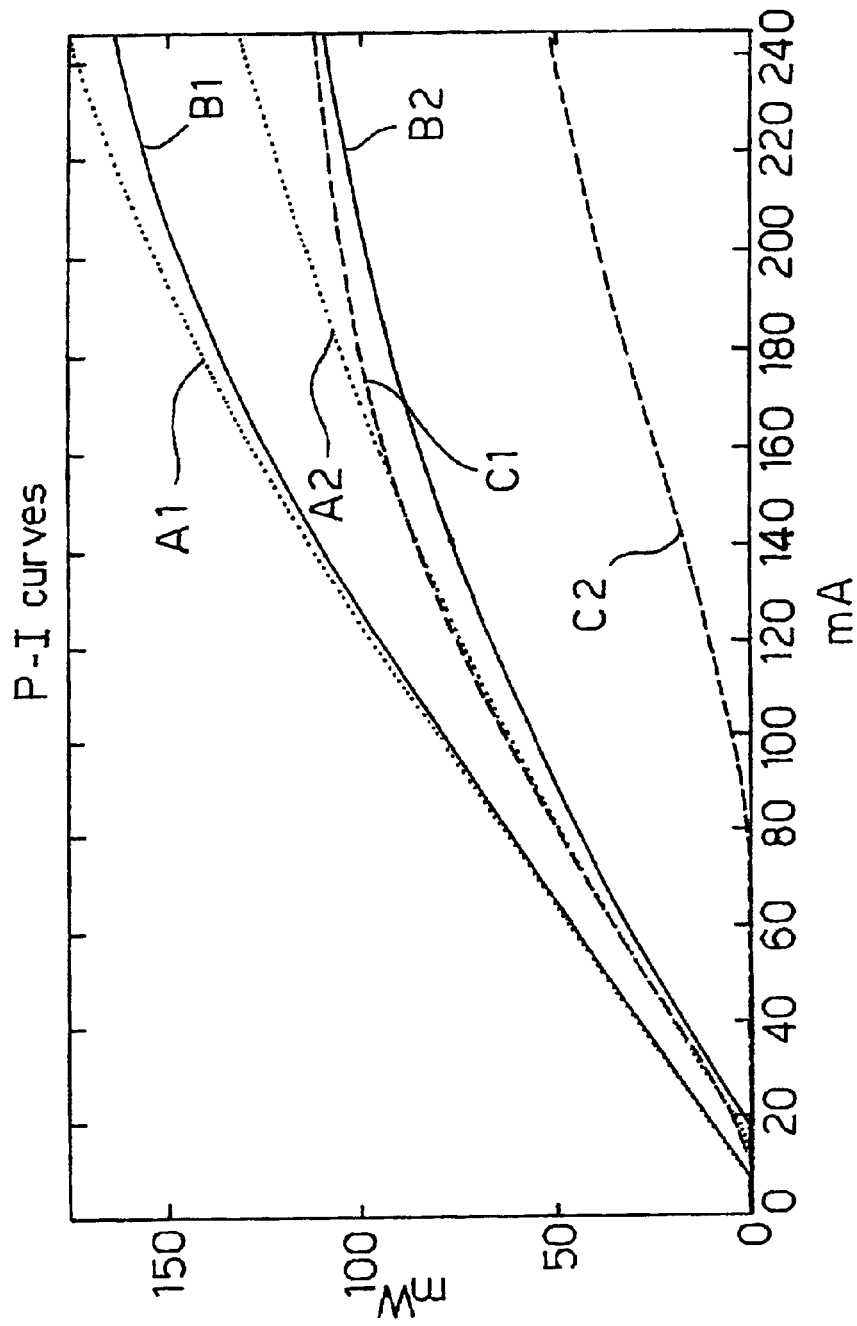

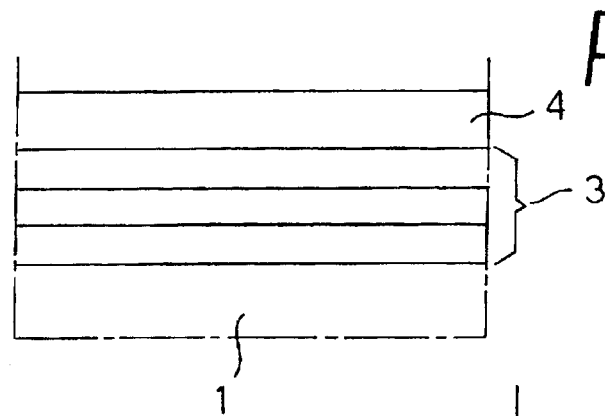
Fig_3
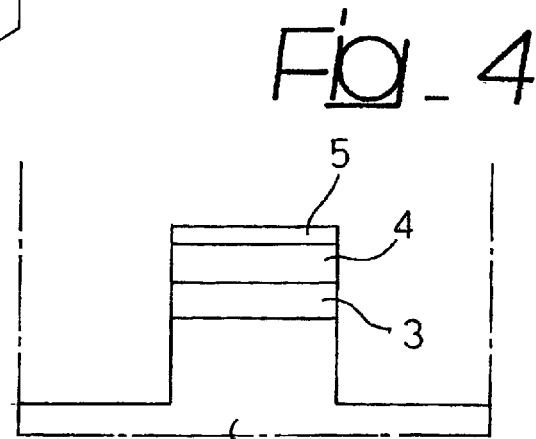
Fig_4
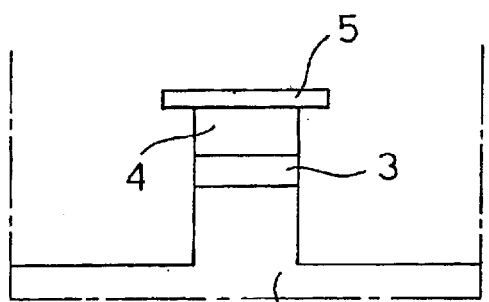
Fig_5
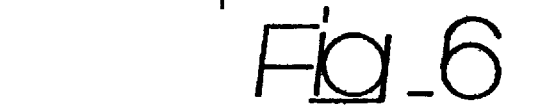
Fig_6
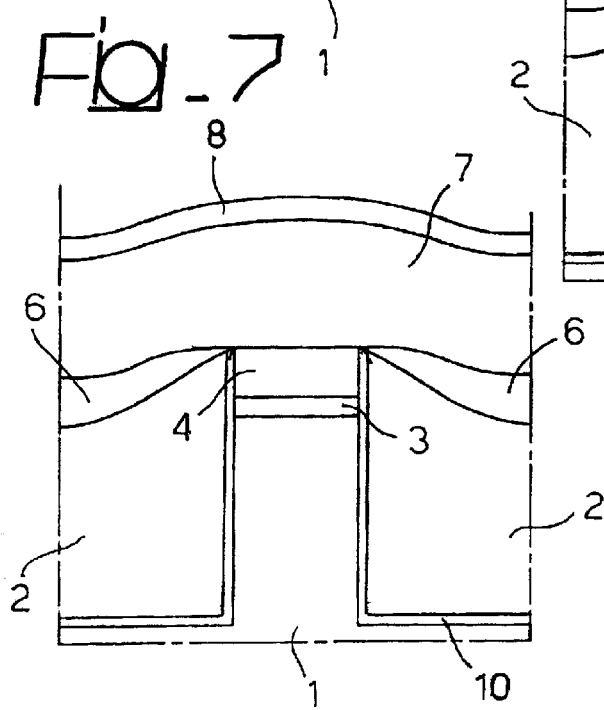
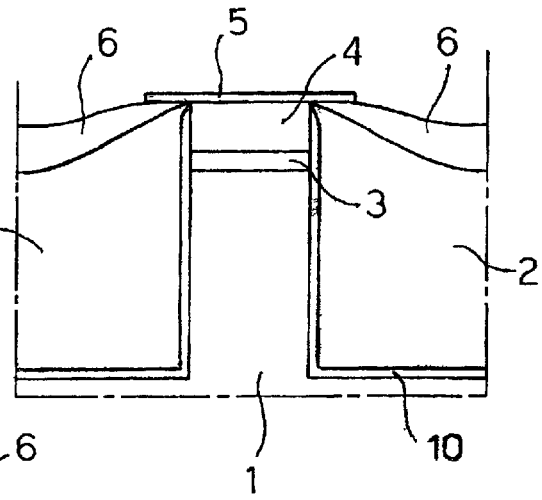
Fig_7

SEMICONDUCTOR LASER STRUCTURE AND METHOD OF MANUFACTURING SAME

The present invention refers to semiconductor lasers and methods of making same.

Exemplary of a prior art semiconductor laser is the arrangement shown in FIG. 1, which is currently referred to as a SIBH (Semi-Insulating Buried Heterojunction) structure.

Specifically, in FIG. 1 reference numeral 1 denotes a n-type substrate defining a mesa like structure laterally confined by an Fe—InP semi-insulating layer 2. Reference numeral 3 denotes the MQW active (i.e. lasing) layers over which a further p layer 4 and a $SiO_2$ mask 5 are provided. Finally, reference numeral 6 indicates an n-InP layer superposed to the Fe—InP semi-insulating layers and adjoining the sides of mask 5 as an anti-diffusion layer to prevent Zn—Fe interdiffusion.

The captioned structure is conventional in the art and may be resorted to for manufacturing, i.a. SIBH-DFB (Distributed Feed Back) lasers operating e.g. in the 1.3 micrometer wavelength range.

A problem currently encountered with such structures is that, while being fully effective at room temperature (or lower), at higher temperatures (around 80° C. or above) the semi-insulating behavior of the Fe—InP layers is no longer satisfactory. This is essentially due to a fairly large leakage current being established across the Fe—InP regions.

Furthermore, since the Fe—InP layers are in contact with the MQW active layers, the Fe atoms will diffuse into the MQW layers and the p-InP layer (denoted 4 in FIG. 1) located above the MQW layers. This results both in reduced reliability and in high series resistance. Specifically, a 0.2–0.3 micrometer diffusion region of Fe into the MQW region can be observed by low temperature cathode luminescence. Also, a 0.2–0.3 equivalent reduction of the p-InP width (layer 4) caused by Fe—Zn interdiffusion can be detected by series resistance measurements.

In order to reduce the leakage current, an alternative SIBH structure has been proposed where a wide-bandgap layer is arranged between the original mesa arrangement and the semi-insulating layer: see S. Asada et al., "Analysis of Leakage Current in Buried Heterostructure Lasers with Semiinsulating Blocking Layers", IEEE Journal of Quantum Electronics, Vol. 25, No. 6, June 1989, pp. 1362–1368.

The leakage current can thus be greatly reduced due to a large turn-on voltage of the wide-bandgap material (e.g. a thin InGaP layer).

The main disadvantage of that arrangement is related in the growth of the wide-bandgap layer by means of MOCVD (Metal Organic Chemical Vapor Deposition). The high mismatch between InP and InGaP does not in fact permit an InGaP layer to be grown even in the range of 100 nanometers, which causes reliability deterioration under high temperature working conditions.

The object of the present invention is thus to provide a further improved solution overcoming the disadvantages outlined in the foregoing.

According to the present invention, that object is achieved by means of a semiconductor laser structure having the features called for in the annexed claims. The invention also relates to the corresponding manufacturing method.

The invention will now be described, by way of example only, with reference to the annexed drawings, where:

FIG. 1, related to the prior art, has been already described in the foregoing,

FIG. 2 shows an exemplary embodiment of the invention by way of direct comparison to the prior art arrangement shown in FIG. 1, FIGS. 3 to 7 schematically show subsequent steps in the manufacturing process of a semiconductor laser structure according to the invention, and FIG. 8 is a diagram showing the behaviour of the solution of the invention in comparison with prior art arrangements.

In FIGS. 2 to 7 parts and components of a SIBH-DFB semiconductor laser structure which are identical or functionally equivalent to those already described in connection with FIG. 1 were designated with the same reference numerals appearing in FIG. 1.

The exemplary, presently preferred embodiment of the invention shown in FIG. 2, provides for a thin (e.g. 0.2–0.3 micrometer) p layer 10 being provided to separate the Fe—InP layers 2 from the n layer 1, the MQW layers 3 and the P—InP layer 4 comprising the basic layer structure.

Preferably, layer 10—which extends over the Fe—InP layers in direct contact therewith—is a p-InP layer doped with zinc (Zn) to $2.10^{+18}/cm^3$.

Provision of the p layer involves several advantages over the structures of the prior art.

First of all, the leakage current at high temperatures is reduced to the point of being almost negligible while the p-InP layer 10, being intrinsically thin, improves series resistance behaviour.

For a 1.3 micrometer wavelength SIBH laser, the mesa width will be in the range of 1.5 micrometers and the series resistance may be increased due to Zn—Fe interdiffusion between layer 4 and layer 2. The equivalent interdiffusion region is 0.2–0.3 micrometers.

However, with the insertion of the highly-doped P—InP layer 10 (0.2–0.3 micrometers) this Zn—Fe interdiffusion region is shifted out of the original mesa, whereby series resistance is unaffected by the interdiffusion effect. To minimise the Fe—Zn interdiffusion effects the Zn doping level in layer 10 should be high enough, in the range of $2 \times 10^{18}$ $cm^{-3}$, while the Fe doping level in layer 2 is optimised around $5 \times 10^{16}$ $cm^{-3}$ with a trade-off between high resistivity (high Fe doping level) and minimal Fe-diffusion effect (low Fe doping level).

The reduced thickness of layer 10 also has little impact on the basic structure of FIG. 1 insofar as the Fe—InP layer 2 is concerned. Specifically, by resorting to current MOCVD growth techniques, a thicker Fe—InP layer can be easily grown to a thickness from between 1.0 and 2.0 micrometers, that is values currently required for 10 Gbit/s direct modulation, without being affected by the insertion of the thin P—InP layer 10.

Furthermore, in the arrangement of the invention direct contact between the Fe—InP layers and the MQW layers is avoided, thus avoiding Fe diffusion into the MQW layers.

Finally, the structure of the invention is intrinsically simple to manufacture while also providing an extensive degree of freedom in controlling the mesa width and the Fe—InP thickness, reducing both series resistance and parasitic capacitance.

The process of manufacturing a laser structure according to the invention will now be briefly discussed with reference to FIGS. 3 to 7. Those skilled in the art will promptly appreciate that the various steps referred to are carried out by resorting to standard technologies and processes, thus rendering any detailed description of such technologies and processes unnecessary within the framework of the present description.

FIG. 3 essentially shows a n substrate over which the MQW active layers (jointly designated 3) and a thin (about 0.5 micrometers) p cladding layer 4 are grown.

Again, those skilled in the art will promptly appreciate that relative proportions of the various layers involved were not strictly reproduced to scale in FIGS. 3 to 7 in order to facilitate understanding of the steps described.

After forming a $SiO_2$ (or $Si_3N_4$) mask on top of the layers already provided, a typical mesa structure of about 2 micrometer width is formed by a first reactive ion etching (RIE) step (FIG. 4). This is followed by a slight wet chemical etch to form an "underetch" of typically less than 0.5 micrometer under mask 5 (FIG. 5).

The highly doped thin p-InP layer 10, the Fe—InP semi-insulating layers 2 and the n-InP layers 6, having a thickness in the range of 0.5 micrometers and a doping level (Sn) of $1-2\times10^{+18}$ $cm^{-3}$ are subsequently grown by MOCVD (FIG. 6).

Finally, after removing mask 5, p-InP and p-InGaAs cladding and contact layers 7 and 8 are grown to complete the structure. This is subsequently subjected to deposition of p-metal, backside thinning and deposition of n-metal according to conventional finishing steps (not shown).

In the diagram of FIG. 8, power v. current (P-I) curves are shown which were derived for the laser structure of the invention (curves A1 and A2) referring to operation at nearly ambient temperature i.e. 27° C. and 90° C., respectively.

Corresponding curves are also shown in FIG. 8 for the structure of FIG. 1 (curves C1 and C2, again referring to operation at 27° C. and 90° C., respectively) and for a similar arrangement using a p-n junction as the lateral blocking layer (curves B1—27° C. and B2—90° C.).

FIG. 8 shows that high temperature performance of the structure of the invention is comparable—and significantly better for high current values—with respect to low temperature performance of the conventional prior art structure of the FIG. 1.

In comparison to both the sets of curves B1, B2 and C1, C2, the P-I curves of the invention (curves A1, A2) demonstrate improved performance both in terms absolute value and—more to the point—in terms of linearity.

Even without wishing to be bound to any specific theory in that respect, the improved performance of the arrangement of the invention may perhaps be explained by considering that the arrangement of the invention gives rise to electron paths which enter into the mesa structure from below to give rise to a sort of funnel effect.

Specifically, in the arrangement of the invention, the heavily p-doped layer 10, grown laterally—and under—the semi-insulating Fe regions 2 prevents electrons from leaking into the Fe-layer, effectively driving them into the MQW active layers also at high temperature.

Essentially, the arrangement of the invention solves the problem of resistivity loss in the Fe—InP layer at high temperature without giving rise to any limitation in growing the Fe—InP blocking layer, thus permitting e.g. a thin n-layer to be grown above the p-doped layer, without affecting performance.

Of course, the basic principle of the invention remaining the same, the details and embodiments may vary with respect to the exemplary embodiment shown herein without departing from the scope of the invention as defined in the annexed claims.

What is claimed is:

1. A semiconductor laser structure comprising a region having at least one active laser layer, said region being confined by at least one Fe doped lateral semi-insulating layer, a p layer interposed as a blocking layer between and in direct contact with said region and said at least one Fe doped lateral semi-insulating layer, said p blocking layer extending from the lower surface to the up er surface of said at least one Fe doped lateral semi-insulating layer, and an n cladding layer superposed to said at least one Fe doped lateral semi-insulating layer.

2. The semiconductor laser of claim 1, wherein said region includes of a mesa structure confined by opposed lateral semi-insulating layers, respective p layers being interposed as blocking layers between said mesa structure and said lateral semi-insulating layers.

3. The semiconductor laser of claim 2, wherein said p blocking layer has a thickness of between 0.2 and 0.3 micrometers.

4. The semiconductor laser of claim 1, wherein said region includes of a mesa structure confined by opposed lateral semi-insulating layers, respective p layers being interposed as blocking layers between said mesa structure and said lateral semi-insulating layers.

5. The semiconductor laser of claim 1, wherein said p blocking layer has a thickness of between 0.2 and 0.3 micrometers.

6. The semiconductor laser of claim 1, wherein said p blocking layer is a p-InP layer.

7. The semiconductor laser of claim 6, wherein said p blocking layer is doped with a density in the range $2.10^{18}/cm^3$.

8. The semiconductor laser of claim 7, wherein said p blocking layer is doped with zinc.

9. The semiconductor laser of claim 8, wherein said at least one lateral semi-insulating layer is doped with a Fe level of $5\times10^{16}/cm^3$.

10. The semiconductor laser of claim 9, wherein said at least one lateral semi-insulating layer has a thickness between 1.0 and 2.0 micrometers.

11. The semiconductor laser of claim 1, wherein said p blocking layer is doped with a density in the range $2.10^{18}/cm^3$.

12. The semiconductor laser of claim 1, wherein said p blocking layer is doped with zinc.

13. The semiconductor laser of claim 1, wherein said at least one lateral semi-insulating layer is doped with a Fe level of $5\times10^{16}/cm^3$.

14. The semiconductor laser of claim 1, wherein said at least one lateral semi-insulating layer has a thickness between 1.0 and 2.0 micrometers.

15. A method of manufacturing the semiconductor laser according to claim 1, comprising growing said p blocking layer over said region, growing said at least one lateral semi-insulating layer over said p blocking layer, and growing at least one lateral n-InP blocking layer aver said at least one lateral semi-insulating layer.

16. The method of claim 15, wherein said p blocking layer is grown by metal organic chemical vapor deposition (MOCVD).

* * * * *